(12) United States Patent
Hasegawa

(10) Patent No.: US 7,776,742 B2
(45) Date of Patent: Aug. 17, 2010

(54) FILM-FORMING METHOD

(75) Inventor: Toshio Hasegawa, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 766 days.

(21) Appl. No.: 10/585,732

(22) PCT Filed: Jan. 14, 2005

(86) PCT No.: PCT/JP2005/000384

§ 371 (c)(1),
(2), (4) Date: Jul. 12, 2006

(87) PCT Pub. No.: WO2005/069358

PCT Pub. Date: Jul. 28, 2005

(65) Prior Publication Data

US 2008/0226823 A1  Sep. 18, 2008

(30) Foreign Application Priority Data

Jan. 15, 2004  (JP)  ............................. 2004-008019

(51) Int. Cl.
*H01L 21/44* (2006.01)

(52) U.S. Cl. ............... 438/680; 438/683; 257/E21.477; 257/E21.478; 427/255.28; 118/715

(58) Field of Classification Search ................. 438/239, 438/240, 250, 584, 680, 683; 257/68, 71, 257/296, 301, 306, 906, E21.008, E21.396, 257/E21.664, E21.477, E21.478; 427/255.28, 427/255.394, 576; 118/715, 725
See application file for complete search history.

(56) References Cited

U.S. PATENT DOCUMENTS

| 5,279,857 | A | * | 1/1994 | Eichman et al. | ......... 427/255.11 |
| 6,156,107 | A | * | 12/2000 | Hayashi et al. | ................ 96/416 |
| 7,235,482 | B2 | * | 6/2007 | Wu et al. | .................... 438/674 |
| 7,482,283 | B2 | * | 1/2009 | Yamasaki et al. | ............ 438/758 |

FOREIGN PATENT DOCUMENTS

JP  06 283532  10/1994

(Continued)

OTHER PUBLICATIONS

Hirotaka Hamamura, et al., "TiN Films Prepared by Flow Modulation Chemical Vapor Deposition Using TiCl₄ and NH₃", Japanese Journal of Applied Physics, vol. 40, No. 3A, Part 1, XP001078015, Mar. 1, 2003, pp. 1517-1521.

*Primary Examiner*—Khiem D Nguyen
(74) *Attorney, Agent, or Firm*—Oblon, Spivak, McClelland, Maier & Neustadt, L.L.P.

(57) ABSTRACT

A TiN film is formed to have a predetermined thickness on a semiconductor wafer by heating the semiconductor wafer at a film formation temperature within a process container and performing a cycle including a first step and a second step at least once. The first step is arranged to supply a $TiCl_4$ gas and a $NH_3$ gas to form a film of TiN by CVD. The second step is arranged to stop the $TiCl_4$ gas and supply the $NH_3$ gas. In film formation, the semiconductor wafer is set at a temperature of less than 450° C. and the process container is set to have therein a total pressure of more than 100 Pa. The $NH_3$ gas is set to have a partial pressure of 30 Pa or less within the process container in the first step.

17 Claims, 11 Drawing Sheets

FOREIGN PATENT DOCUMENTS

| | | |
|---|---|---|
| JP | 08 250596 | 9/1996 |
| JP | 11 172438 | 6/1999 |
| JP | 2000 068232 | 3/2000 |
| JP | 2001 040477 | 2/2001 |
| JP | 2003 077864 | 3/2003 |
| JP | 2003 213418 | 7/2003 |

* cited by examiner

FILM-FORMING METHOD

TECHNICAL FIELD

The present invention relates to a film formation method by CVD, and more specifically to a film formation method for forming a metal nitride film, such as a TiN family thin film, used as, e.g., a barrier layer, capacitor upper electrode, gate electrode, or contact portion in semiconductor devices.

BACKGROUND ART

In recent years, multi-layered interconnection structures are being increasingly used for circuitry, because higher density and higher integration degree are required in manufacturing semiconductor devices. Under the circumstances, embedding techniques for electrical connection between layers have become important, e.g., at contact holes used as connections between an underlying semiconductor device and upper interconnection layers, and at via-holes used as connections between upper and lower interconnection layers. Further, in order to meat high dielectric constant materials, such as $Ta_2O_5$ and $HfO_2$, used as capacitor materials in, e.g., DRAM memory sections, techniques for forming an upper electrode thereon with higher coverage have also become important, along with the increase in integration degree.

Recently, TiN films are used as barrier layers for metal filled in contact holes and via-holes, and as upper electrodes in capacitors, as described above.

Conventionally, PVD is utilized in methods for forming TiN films of this kind. However, in recent years, along with the increase in miniaturization and integration degree of devices, CVD is sometimes utilized, because CVD can be expected to provide a film with better quality and higher coverage.

Where a TiN film is formed by CVD, film formation is performed at a temperature of 500 to 600° C. while $TiCl_4$ used as a reactive gas and $NH_3$ or MMH (monomethylhydrazine) used as a nitrogen-containing reducing gas are supplied. Further, in order to prevent the underlayer from being affected by film formation, a technique has been proposed of alternately repeating a step of supplying a reactive gas and a reducing gas and a step of supplying only the reducing gas, thereby allowing the film formation to be performed at a low temperature of about 450° C. (Patent Document 1).

However, high dielectric constant materials, such as $Ta_2O_5$ and $HfO_2$, are sensitive to temperature. In addition, where a TiN film is formed thereon as an upper electrode, it is necessary to perform the film formation at a low temperature of less than 450° C. so as to prevent the underlayer from suffering thermal damage. In this respect, if the technique disclosed in Patent Document 1 is used to perform practical film formation at such a low temperature, abnormal growth occurs during formation of metal nitride films and causes problems, such as degradation in film quality and increase in resistivity.

Further, there is a case where NiSi is used as a contact material, although NiSi is low in heat resistance. Accordingly, where a metal nitride film is formed on an NiSi underlayer, it is preferable to perform the film formation at a low temperature of 450° C. or less.

Furthermore, in recent years, along with the increase in density and integration degree being required, it has become necessary to improve step coverage.

Patent Document 1: Jpn. Pat. Appln. KOKAI Publication No. 2003-77864

DISCLOSURE OF INVENTION

An object of the present invention is to provide a film formation method which allows a metal nitride film to be formed with high quality and high step coverage by CVD at a low film formation temperature of less than 450° C.

According to a first aspect of the present invention, there is provided a film formation method for forming a metal nitride film having a predetermined thickness on a target substrate by heating the target substrate at a film formation temperature within a process container and performing a cycle comprising a first step and a second step at least once, such that the first step is arranged to supply a metal compound gas and a nitrogen-containing reducing gas to form a film of a metal nitride by CVD, and the second step is arranged to stop the metal compound gas and supply the nitrogen-containing reducing gas, wherein, in film formation, the target substrate is set at a temperature of less than 450° C., the process container is set to have therein a total pressure of more than 100 Pa, and the nitrogen-containing reducing gas is set to have a partial pressure of 30 Pa or less within the process container in the first step.

According to a second aspect of the present invention, there is provided a film formation method for forming a TiN film having a predetermined thickness on a target substrate by heating the target substrate at a film formation temperature within a process container and performing a cycle comprising a first step and a second step at least once, such that the first step is arranged to supply a Ti compound gas and a nitrogen-containing reducing gas to form a film of TiN by CVD, and the second step is arranged to stop the Ti compound gas and supply the nitrogen-containing reducing gas, wherein, in film formation, the target substrate is set at a temperature of less than 450° C., the process container is set to have therein a total pressure of more than 100 Pa, and the nitrogen-containing reducing gas is set to have a partial pressure of 30 Pa or less within the process container in the first step.

According to a third aspect of the present invention, there is provided a film formation method for forming an initial metal nitride film having a first thickness on a target substrate by heating the target substrate at a film formation temperature within a process container and performing a cycle comprising a first step and a second step at least once, such that the first step is arranged to supply a metal compound gas and a nitrogen-containing reducing gas to form a film of a metal nitride by CVD, and the second step is arranged to stop the metal compound gas and supply the nitrogen-containing reducing gas; and then forming thereon an additional metal nitride film having a second thickness by continuous CVD arranged to supply a metal compound gas and a nitrogen-containing reducing gas onto the target substrate, wherein, in formation of the initial metal nitride film, the target substrate is set at a temperature of less than 450° C., the process container is set to have therein a total pressure of more than 100 Pa, and the nitrogen-containing reducing gas is set to have a partial pressure of 30 Pa or less within the process container in the first step.

According to a fourth aspect of the present invention, there is provided a film formation method for forming an initial metal nitride film having a first thickness on a target substrate by heating the target substrate at a film formation temperature within a process container and performing a cycle comprising a first step and a second step at least once, such that the first step is arranged to supply a metal compound gas and a nitrogen-containing reducing gas to form a film of a metal nitride by CVD, and the second step is arranged to stop the metal compound gas and supply the nitrogen-containing reducing gas; and then forming thereon an additional metal nitride film having a second thickness by performing a cycle comprising the first step and the second step at least once, wherein, in formation of the initial metal nitride film, the target substrate is set at a temperature of less than 450° C., the process container is set to have therein a total pressure of more than 100 Pa, and the nitrogen-containing reducing gas is set to have a partial pressure of 30 Pa or less within the process container in the first step, and wherein, in formation of the additional metal nitride film, the nitrogen-containing reducing gas is set to have a partial pressure of more than 30 Pa within the process container in the first step.

According to a fifth aspect of the present invention, there is provided a film formation method for forming a metal nitride film having a predetermined thickness on a target substrate by heating the target substrate at a film formation temperature within a process container and performing a cycle comprising a first step and a second step at least once, such that the first step is arranged to supply a metal compound gas and a nitrogen-containing reducing gas to form a film of a metal nitride by CVD, and the second step is arranged to stop the metal compound gas and supply the nitrogen-containing reducing gas, wherein, in film formation, the target substrate is set at a temperature of less than 450° C., and the process container is set to have therein a total pressure of more than 100 Pa, and wherein the metal nitride film is set to have a resistivity R of 800 μΩ-cm or less calculated by a following formula (A);

$$R=115.75 \times Ln(T_{hk})+71.576 \times Ln(P_N)+418.8 \quad (A)$$

where $P_N$ (Pa) denotes a partial pressure of the nitrogen-containing reducing gas within the process container in the first step, and $T_{hk}$ (nm) denotes a film thickness obtained by the cycle performed once.

According to a sixth aspect of the present invention, there is provided a film formation method for forming a metal nitride film having a predetermined thickness on a target substrate by heating the target substrate at a film formation temperature within a process container and performing a cycle comprising a first step and a second step at least once, such that the first step is arranged to supply a metal compound gas and a nitrogen-containing reducing gas to form a film of a metal nitride by CVD, and the second step is arranged to stop the metal compound gas and supply the nitrogen-containing reducing gas, wherein, in film formation, the target substrate is set at a temperature of less than 450° C., and the process container is set to have therein a total pressure of more than 100 Pa, and wherein the metal nitride film is set to have a resistivity R of 800 μΩ-cm or less calculated by a following formula (B);

$$R=115.75 \times Ln(T_{hk})+71.576 \times Ln(P_N)-57.685 \times Ln(F_N)+614 \quad (B)$$

where $P_N$ (Pa) denotes a partial pressure of the nitrogen-containing reducing gas within the process container in the first step, $T_{hk}$ (nm) denotes a film formation thickness obtained by the cycle performed once, and $F_N$ (mL/min) denotes a flow rate of the nitrogen-containing reducing gas in the first step.

According to a seventh aspect of the present invention, there is provided a film formation method for forming a metal nitride film having a predetermined thickness on a target substrate by heating the target substrate at a film formation temperature within a process container and performing a cycle comprising a first step and a second step at least once, such that the first step is arranged to supply a metal compound gas and a nitrogen-containing reducing gas to form a film of a metal nitride by CVD, and the second step is arranged to stop the metal compound gas and supply the nitrogen-containing reducing gas, wherein, in film formation, the target substrate is set at a temperature of less than 450° C., and the process container is set to have therein a total pressure of more than 100 Pa, and wherein the metal nitride film is set to have a resistivity R of 800 μΩ-cm or less calculated by a following formula (C);

$$R=115.75 \times Ln(T_{hk})+71.576 \times Ln(P_N)-57.685 \times Ln(F_N)-2844.6Ln(T_W)+17658.3 \quad (C)$$

where $P_N$ (Pa) denotes a partial pressure of the nitrogen-containing reducing gas within the process container in the first step, $T_{hk}$ (nm) denotes a film formation thickness obtained by the cycle performed once, $F_N$ (mL/min) denotes a flow rate of the nitrogen-containing reducing gas in the first step, and $T_W$ (° C.) denotes temperature of the target substrate.

According to an eighth aspect of the present invention, there is provided a computer readable medium containing software for a computer to control a film formation apparatus, so as to form a metal nitride film having a predetermined thickness on a target substrate by heating the target substrate at a film formation temperature within a process container and performing a cycle comprising a first step and a second step at least once, such that the first step is arranged to supply a metal compound gas and a nitrogen-containing reducing gas to form a film of a metal nitride by CVD, and the second step is arranged to stop the metal compound gas and supply the nitrogen-containing reducing gas, wherein, in film formation, the target substrate is set at a temperature of less than 450° C., the process container is set to have therein a total pressure of more than 100 Pa, and the nitrogen-containing reducing gas is set to have a partial pressure of 30 Pa or less within the process container in the first step.

According to a ninth aspect of the present invention, there is provided a computer readable medium containing software for a computer to control a film formation apparatus, so as to form a TiN film having a predetermined thickness on a target substrate by heating the target substrate at a film formation temperature within a process container and performing a cycle comprising a first step and a second step at least once, such that the first step is arranged to supply a Ti compound gas and a nitrogen-containing reducing gas to form a film of TiN by CVD, and the second step is arranged to stop the Ti compound gas and supply the nitrogen-containing reducing gas, wherein, in film formation, the target substrate is set at a temperature of less than 450° C., the process container is set to have therein a total pressure of more than 100 Pa, and the nitrogen-containing reducing gas is set to have a partial pressure of 30 Pa or less within the process container in the first step.

According to a tenth aspect of the present invention, there is provided a computer readable medium containing software for a computer to control a film formation apparatus, so as to form a metal nitride film having a predetermined thickness on a target substrate by heating the target substrate at a film formation temperature within a process container and performing a cycle comprising a first step and a second step at least once, such that the first step is arranged to supply a metal compound gas and a nitrogen-containing reducing gas to form a film of a metal nitride by CVD, and the second step is arranged to stop the metal compound gas and supply the nitrogen-containing reducing gas, wherein, in film formation, the target substrate is set at a temperature of less than 450° C., and the process container is set to have therein a total pressure of more than 100 Pa, and wherein the metal nitride film is set to have a resistivity R of 800 μΩ-cm or less calculated by a following formula (A);

$$R = 115.75 \times Ln(T_{hk}) + 71.576 \times Ln(P_N) + 418.8 \quad (A)$$

where $P_N$ (Pa) denotes a partial pressure of the nitrogen-containing reducing gas within the process container in the first step, and $T_{hk}$ (nm) denotes a film thickness obtained by the cycle performed once.

According to an eleventh aspect of the present invention, there is provided a computer readable medium containing software for a computer to control a film formation apparatus, so as to form a metal nitride film having a predetermined thickness on a target substrate by heating the target substrate at a film formation temperature within a process container and performing a cycle comprising a first step and a second step at least once, such that the first step is arranged to supply a metal compound gas and a nitrogen-containing reducing gas to form a film of a metal nitride by CVD, and the second step is arranged to stop the metal compound gas and supply the nitrogen-containing reducing gas, wherein, in film formation, the target substrate is set at a temperature of less than 450° C., and the process container is set to have therein a total pressure of more than 100 Pa, and wherein the metal nitride film is set to have a resistivity R of 800 μΩ-cm or less calculated by a following formula (B);

$$R = 115.75 \times Ln(T_{hk}) + 71.576 \times Ln(P_N) - 57.685 \times Ln(F_N) + 614 \quad (B)$$

where $P_N$ (Pa) denotes a partial pressure of the nitrogen-containing reducing gas within the process container in the first step, $T_{hk}$ (nm) denotes a film formation thickness obtained by the cycle performed once, and $F_N$ (mL/min) denotes a flow rate of the nitrogen-containing reducing gas in the first step.

According to a twelfth aspect of the present invention, there is provided a computer readable medium containing software for a computer to control a film formation apparatus, so as to form a metal nitride film having a predetermined thickness on a target substrate by heating the target substrate at a film formation temperature within a process container and performing a cycle comprising a first step and a second step at least once, such that the first step is arranged to supply a metal compound gas and a nitrogen-containing reducing gas to form a film of a metal nitride by CVD, and the second step is arranged to stop the metal compound gas and supply the nitrogen-containing reducing gas, wherein, in film formation, the target substrate is set at a temperature of less than 450° C., and the process container is set to have therein a total pressure of more than 100 Pa, and wherein the metal nitride film is set to have a resistivity R of 800 μΩ-cm or less calculated by a following formula (C);

$$R = 115.75 \times Ln(T_{hk}) + 71.576 \times Ln(P_N) - 57.685 \times Ln(F_N) - 2844.6 Ln(T_W) + 17658.3 \quad (C)$$

where $P_N$ (Pa) denotes a partial pressure of the nitrogen-containing reducing gas within the process container in the first step, $T_{hk}$ (nm) denotes a film formation thickness obtained by the cycle performed once, $F_N$ (mL/min) denotes a flow rate of the nitrogen-containing reducing gas in the first step, and $T_W$ (° C.) denotes temperature of the target substrate.

According to the first and second aspects of the present invention, the nitrogen-containing reducing gas is set to have a partial pressure of 30 Pa or less. With this arrangement, the film formation rate is decreased to prolong the time period for the reaction between the metal compound gas and nitrogen-containing reducing gas, so the metal compound gas is sufficiently subjected to a reduction process by the nitrogen-containing reducing gas. Further, the total pressure is set to be more than 100 Pa, by which high step coverage is realized. Consequently, a high quality metal nitride film, such as a TiN film, with a low resistivity and very little abnormal growth, can be formed with high step coverage, even at a low temperature of less than 450° C. In this respect, conventionally, where a metal compound gas and a nitrogen-containing reducing gas are used to form a metal nitride film, the nitrogen-containing reducing gas is set to have a high partial pressure to perform the film formation with a high film formation rate. However, according to the present invention, the nitrogen-containing reducing gas is set to have a partial pressure of 30 Pa or less, as described above. With this arrangement, a high quality metal nitride film can be formed even where the film formation is performed at a low temperature.

According to the third and fourth aspects of the present invention, an initial metal nitride film having a first thickness is formed by a method according to the first and second aspects, respectively, and then an additional metal nitride film having a second thickness is formed by a method that can perform film formation with high throughput. In this case, the initial metal nitride film that can affect the underlayer is formed at a low temperature to be a high quality film with a low resistivity, and then the additional metal nitride film that does not affect the underlayer is formed with high throughput. Consequently, it is possible not only to perform film formation at a low temperature to form a high quality metal nitride film with a low resistivity, but also to improve the throughput of film formation of the metal nitride film.

According to the fifth aspect of the present invention, an optimum combination of the partial pressure of the nitrogen-containing reducing gas and the number of intermittent supply cycles is selected in consideration of the influence applied from both of them on the film quality of a metal nitride film, while the total pressure is set to be more than 100 Pa. Consequently, a high quality metal nitride film, such as a TiN film, can be formed with high step coverage, at a low temperature of less than 450° C., without a needless increase in the number of cycles. In this respect, conventionally, where a metal compound gas and a nitrogen-containing reducing gas are intermittently supplied to form a metal nitride film, it is known that, along with an increase in the number of intermittent supply repetitions (cycles), the resistivity of the metal nitride film is decreased and the quality of the metal nitride film is improved, but the throughput becomes very low. According to the present invention, however, the partial pressure of the nitrogen-containing reducing gas and the number of intermittent supply cycles are optimized, whereby a high quality metal nitride film can be formed at a low temperature without extremely deteriorating the throughput.

According to the sixth and seventh aspects of the present invention, in addition to the partial pressure of the nitrogen-containing reducing gas and the number of intermittent supply cycles, other parameters influential on the film quality, i.e., the flow rate of the nitrogen-containing reducing gas and the temperature of the target substrate, are considered to select an optimum combination of the parameters for forming a metal nitride film. Consequently, a high quality metal nitride film, such as a TiN film, can be more reliably formed with high step coverage, at a low temperature of less than 450° C.

BEST MODE FOR CARRYING OUT THE INVENTION

Embodiments of the present invention will now be described with reference to the accompanying drawings.

In the embodiments, an explanation will be given of a case where $TiCl_4$ gas is used as a metal compound gas and $NH_3$ gas is used as a nitrogen-containing reducing gas to form a thin film of titanium nitride (TiN) by thermal CVD.

Figure 1:
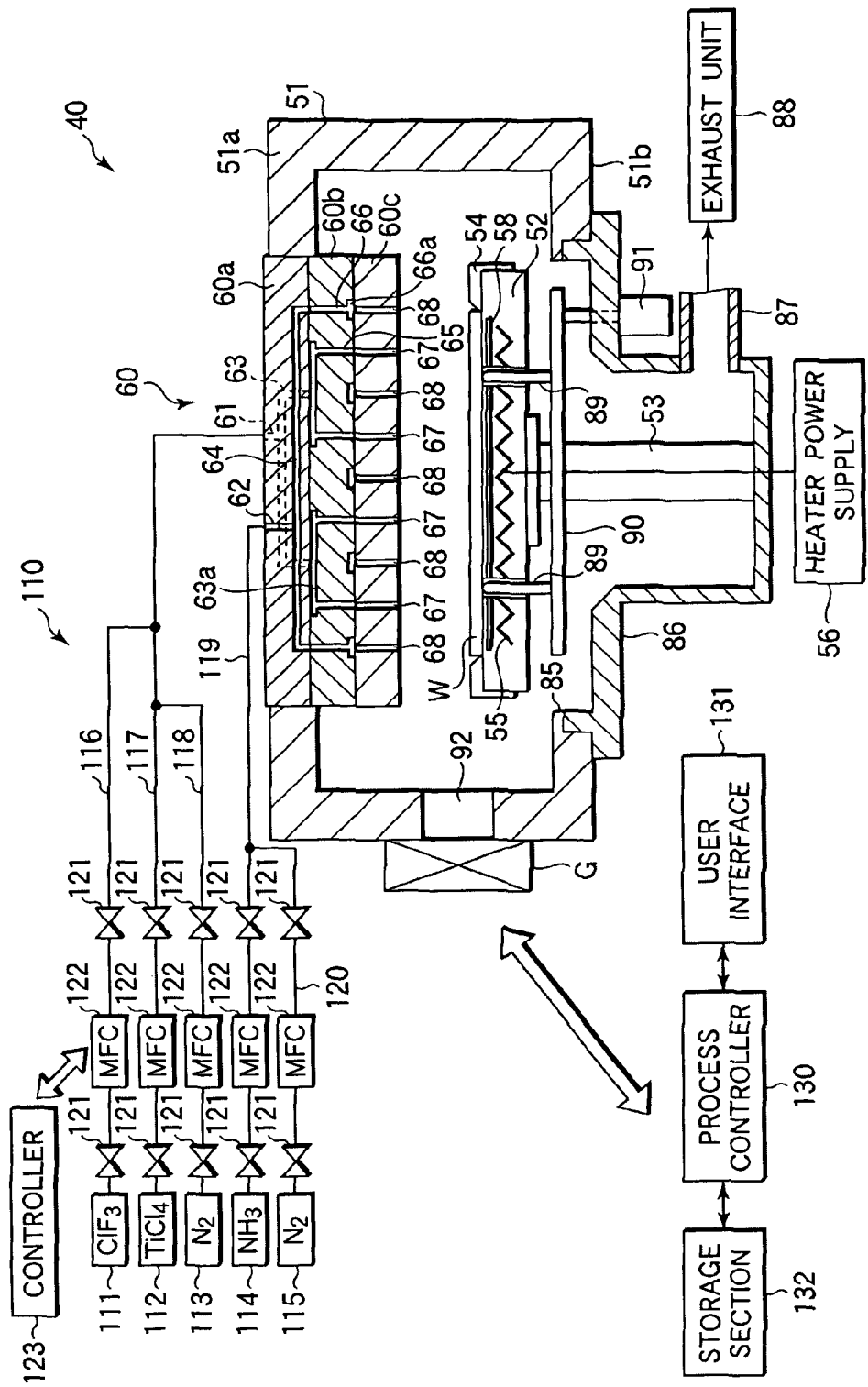
FIG. 1 is a sectional view schematically showing an example of the structure of a film formation apparatus used for a film formation method according to the present invention.

FIG. 1 is a structural view schematically showing an example of a film formation apparatus used for a film formation method according to the present invention.

The film formation apparatus 40 includes a substantially cylindrical airtight chamber 51. The chamber 51 is provided with a susceptor 52 disposed therein for supporting a target substrate or wafer W in a horizontal state. The susceptor 52 is supported by a cylindrical support member 53 disposed therebelow at the center. The susceptor 52 is made of a ceramic, such as AlN, and has a guide ring 54 disposed on the edge to guide the wafer W. The susceptor 52 is provided with a heater 55 built therein. The heater 55 is supplied with a power from a power supply 56 to heat the target substrate or wafer W to a predetermined temperature. Further, the susceptor 52 is provided with an electrode 58 built therein above the heater 55 and used as a lower electrode.

The chamber 51 has a transfer port 92 formed in the sidewall and provided with a gate valve G. The wafer W is transferred by a wafer transfer unit (not shown) between the susceptor 52 and an external wafer transfer chamber (not shown) held in a vacuum state, through the gate valve G.

The susceptor 52 is provided with a plurality of lifter pins 89 that penetrate a mount region for placing the wafer W thereon. The lifter pins 89 are used for moving the wafer W up and down when the wafer W is transferred between the wafer transfer unit (not shown) and the mount region. The lifter pins 89 are driven up and down by an elevating mechanism 91 through a driving arm 90.

The bottom of the chamber 51 is provided with an exhaust container 86 connected to an exhaust unit 88 through an exhaust line 87. The exhaust unit 88 can be operated to uniformly exhaust the chamber 51 and to decrease the inner pressure thereof to a predetermined vacuum level.

A showerhead 60 is disposed on the ceiling wall 51a of the chamber 51. The showerhead 60 is formed of an upper block body 60a, a middle block body 60b, and a lower block body 60c.

Discharge holes 67 and 68 for discharging gases are alternately formed in the lower block body 60c. On the other hand, a first gas introducing port 61 and a second gas introducing port 62 are formed in the upper surface of the upper block body 60a. The first gas introducing port 61 is divided into a number of gas passages 63 in the upper block body 60a. The middle block body 60b has gas passages 65 formed therein, which communicate with the gas passages 63 through communication passages 63a extending horizontally. The gas passages 65 communicate with the discharge holes 67 formed in the lower block body 60c. The second gas introducing port 62 is divided into a number of gas passages 64 in the upper block body 60a. The middle block body 60b has gas passages 66 formed therein, which communicate with the gas passages 64. The gas passages 66 are connected to communication passages 66a extending horizontally in the middle block body 60b. The communication passages 66a communicate with a number of discharge holes 68 formed in the lower block body 60c. The first and second gas introducing ports 61 and 62 are respectively connected to a gas supply mechanism 110 described later.

The gas supply mechanism 110 includes a $ClF_3$ gas supply source 111 for supplying $ClF_3$ gas used as a cleaning gas, a $TiCl_4$ gas supply source 112 for supplying $TiCl_4$ gas used as a Ti-containing gas, a first $N_2$ gas supply source 113 for supplying $N_2$ gas, an $NH_3$ gas supply source 114 for supplying $NH_3$ gas used as a nitriding gas, and a second $N_2$ gas supply source 115 for supplying $N_2$ gas. The $ClF_3$ gas supply source 111 is connected to a $ClF_3$ gas supply line 116, the $TiCl_4$ gas supply source 112 is connected to a $TiCl_4$ gas supply line 117, the first $N_2$ gas supply source 113 is connected to a first $N_2$ gas supply line 118, the $NH_3$ gas supply source 114 is connected to an $NH_3$ gas supply line 119, and the second $N_2$ gas supply source 115 is connected to a second $N_2$ gas supply line 120. Further, the gas supply mechanism 110 includes an Ar gas supply source (not shown). Each of the gas supply lines is provided with a mass-flow controller 122 and two valves 121 one on either side of the controller 122.

The first gas introducing port 61 of the showerhead 60 is connected to the $TiCl_4$ gas supply line 117 extending from the $TiCl_4$ gas supply source 112. The $TiCl_4$ gas supply line 117 is connected to the $ClF_3$ gas supply line 116 extending from the $ClF_3$ gas supply source 111, and is also connected to the first $N_2$ gas supply line 118 extending from the first $N_2$ gas supply source 113. The second gas introducing port 62 is connected to the $NH_3$ gas supply line 119 extending from the $NH_3$ gas supply source 114. The $NH_3$ gas supply line 119 is connected to the second $N_2$ gas supply line 120 extending from the gas supply source 115.

According to this arrangement, when a process is performed, $TiCl_4$ gas from the $TiCl_4$ gas supply source 112 and $N_2$ gas from the first $N_2$ gas supply source 113 are supplied into the $TiCl_4$ gas supply line 117. This mixture gas flows through the first gas introducing port 61 into the showerhead 60, and is then guided through the gas passages 63 and 65 and discharged into the chamber 51 through discharge holes 67. On the other hand, $NH_3$ gas used as a nitrogen-containing reducing gas from the $NH_3$ gas supply source 114 and $N_2$ gas from the second $N_2$ gas supply source 115 are supplied into the $NH_3$ gas supply line 119. This mixture gas flows through the second gas introducing port 62 into the showerhead 60, and is then guided through the gas passages 64 and 66 and discharged into the chamber 51 through discharge holes 68.

In other words, the showerhead 60 is of a post-mix type in which $TiCl_4$ gas and $NH_3$ gas are supplied into the chamber 51 separately from each other. $TiCl_4$ gas and $NH_3$ gas react with each other by thermal energy after they are discharged and mixed.

The valves 121 and mass-flow controllers 122 are controlled by a controller 123.

The respective components of the film formation apparatus 40 are connected to and controlled by a process controller 130. The process controller 130 is connected to a user interface 131 including, e.g. a keyboard and a display, wherein the keyboard is used for a process operator to input commands for operating the film formation apparatus 40, and the display is used for showing visualized images of the operational status of the plasma processing apparatus 40.

Further, the process controller 130 is connected to a storage section 132 that stores control programs for the process controller 130 to control the film formation apparatus 40 so as to perform various processes, and programs or recipes for respective components of the film formation apparatus 40 to perform processes in accordance with process conditions. Recipes may be stored in a hard disk or semiconductor memory, or stored in a portable storage medium, such as a CDROM or DVD, to be attached to a predetermined position in the storage section 132. Further, recipes may be transmitted from another apparatus through, e.g., a dedicated line, as needed.

A required recipe is retrieved from the storage section 132 and executed by the process controller 130 in accordance with an instruction or the like through the user interface 131. As a consequence, the film formation apparatus 40 can perform a predetermined process under the control of the process controller 130.

Next, an explanation will be given of a film formation method according to a first embodiment performed in this apparatus.

At first, the interior of the chamber 51 is exhausted by the exhaust unit 88 at full throttle, and $N_2$ gas is supplied from the first and second gas supply sources 113 and 115 through the showerhead 60 into the chamber 51. In this state, the interior of the chamber 51 is pre-heated by the heater 55. When the temperature becomes stable, $N_2$ gas, $NH_3$ gas, and $TiCl_4$ gas are supplied respectively from the first $N_2$ gas supply source 113, $NH_3$ gas supply source 114, and $TiCl_4$ gas supply source 112 through the showerhead 60 into the chamber 51 at predetermined flow rates, while the pressure inside the chamber 51 is maintained at a at a predetermined value. The $TiCl_4$ gas is first caused to flow through a pre-flow line (not shown) to stabilize the flow rate, and is then switched to flow through the showerhead 60 into the chamber 51. By doing so, a TiN pre-coating film is formed on the surface of the members within the chamber 51, such as the inner wall of the chamber 51, susceptor 52, guide ring 54, and showerhead 60, which are heated by the heater 55.

When the pre-coating process is finished, the $NH_3$ gas and $TiCl_4$ gas are stopped, and $N_2$ gas is supplied as a purge gas from the first and second $N_2$ gas supply sources 113 and 115 into the chamber 51 to purge the interior of the chamber 51. Then, as needed, $N_2$ gas and $NH_3$ gas are supplied to perform a nitriding process on the surface of the TiN pre-coating film, so as to stabilize the pre-coating film.

Thereafter, the interior of the chamber 51 is quickly vacuum-exhausted by the exhaust unit 88 at full throttle. In this state, the gate valve G is opened, and a wafer W is transferred through the transfer port 92 into the chamber 51. Then, $N_2$ gas is supplied into the chamber 51 and the wafer W is pre-heated. When the wafer temperature becomes substantially stable at a film formation temperature, TiN film formation is started.

When a TiN film is formed, the wafer temperature is set by the heater 55 to be less than 450° C., preferably less than 400° C., more preferably 350° C. or less. With this temperature, the film formation can be performed without causing damage to the underlayers even where the underlayers include a film of a capacitor material, such as $Ta_2O_5$, $HfO_2$, HfSiO, PZT, BST, $RuO_2$, or $ReO_2$, or a film of a contact material sensitive to heat, such as NiSi.

Figure 2:
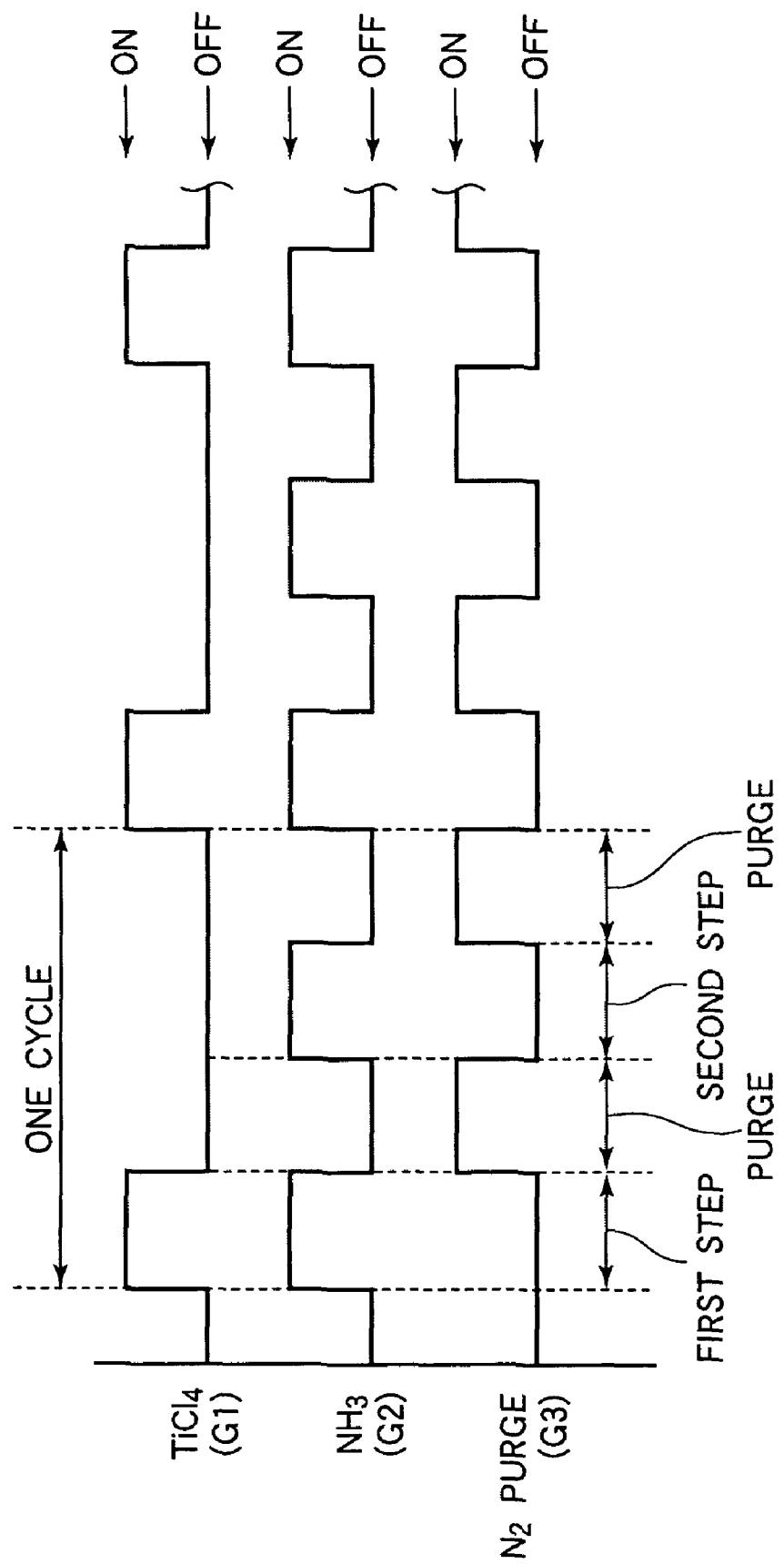
FIG. 2 is a diagram showing an example of gas supply control used in a film formation method according to an embodiment of the present invention.

The TiN film is formed in accordance with the timing chart shown in FIG. 2 while the wafer temperature is set, as described above. At first, a first step of forming a TiN thin film by thermal CVD is performed. In this step, $TiCl_4$ gas G1 and $NH_3$ gas G2 are supplied into the chamber 51 from the $TiCl_4$ gas supply source 112 and $NH_3$ gas supply source 114, respectively, while being carried by $N_2$ gas G3 from the first and second $N_2$ gas supply sources 113 and 115, respectively. Then, $TiCl_4$ gas G1 and $NH_3$ gas G2 are stopped, and $N_2$ gas G3 is supplied as a purge gas from a purge gas line (not shown) into the chamber 51 to purge the interior of the chamber 51. Then, a second step of annealing is performed, wherein $NH_3$ gas G2 is supplied into the chamber 51 from the $NH_3$ gas supply source 114 while being carried by $N_2$ gas G3 from the second $N_2$ gas supply source 115. Then, $NH_3$ gas G2 is stopped, and $N_2$ gas G3 is supplied as a purge gas from a purge gas line (not shown) into the chamber 51 to purge the interior of the chamber 51.

A cycle comprising the steps described above is performed at least once, and preferably repeated a plurality of times, more preferably three times or more, such as 12 to 24 times. The gas switching for this is performed by switching valves under the control of the controller 123.

As described above, the cycle comprising the steps described above is performed at least once to form a TiN film having an aimed thickness on the wafer W. For example, the thickness of the TiN film is set to be 5 to 100 nm, and preferably 10 to 50 nm.

It may be arranged such that a gas containing nitrogen atoms or hydrogen atoms is supplied before the TiN film is formed to slightly nitride the surface of insulating films.

Incidentally, in such film formation performed at a low temperature of less than 450° C., if the $NH_3$ partial pressure is set to be as high as that used for film formation of a conventional TiN film, abnormal growth occurs and thereby causes degradation in film quality and increase in resistivity.

Accordingly, in this embodiment, the $NH_3$ partial pressure is set to be 30 Pa or less in the first step of forming a TiN film. With this arrangement, it is possible to perform practical film formation with very little abnormal growth so as to form a high quality TiN film with a low resistivity. The $NH_3$ partial pressure can be adjusted by the flow rate of $N_2$ gas supplied as a dilution gas.

Conventionally, where a TiN film is formed, since the film formation rate is in proportion to the partial pressure of $NH_3$ gas used as a reducing gas, the $NH_3$ partial pressure is set to be as high as possible within a range in which no harmful by-product powder is generated, so as to attain high throughput film formation. In contrast to this common practice according to the conventional technique, the present embodiment sets the $NH_3$ partial pressure to be as low as 30 Pa or less. With this arrangement, the film formation rate is decreased to prolong the time period for the reaction between $TiCl_4$ and $NH_3$, so $TiCl_4$ is sufficiently subjected to a reduction process by $NH_3$. Consequently, the film formation can be performed at a low temperature, as described above.

The $NH_3$ partial pressure is preferably set to be 20 Pa or less in order to expand the process margin of film formation, which can be performed with very little abnormal growth so as to form a high quality TiN film with a low resistivity. The $NH_3$ partial pressure is more preferably set to be 15 Pa or less.

Further, in this TiN film formation process, the total pressure inside the chamber 51 is set to be higher than 100 Pa during both of the first step and second step. With this arrangement, the step coverage is improved. The upper limit of the total pressure inside the chamber 51 is not necessary specified, but the practical upper limit is about 1,300 Pa in consideration of the apparatus performance. The upper limit is preferably set to be more that 100 Pa and not more than 667 Pa.

According to the conventional film formation process of a TiN film, the total pressure inside the chamber 51 is set to be as low as 100 Pa or less during the film formation, so as to suppress abnormal growth of the TiN film, thereby providing the film with good surface morphology. However, in this case, a problem arises such that the step coverage is deteriorated. On the other hand, according to this embodiment, the $NH_3$ partial pressure is decreased to suppress abnormal growth thereby forming a high quality film.

Consequently, the total pressure inside the chamber 51 is allowed to be higher than 100 Pa, so as to improve both of the film quality and step coverage.

For example, the film thickness obtained by one cycle is 0.25 to 2.50 nm.

Figure 3:
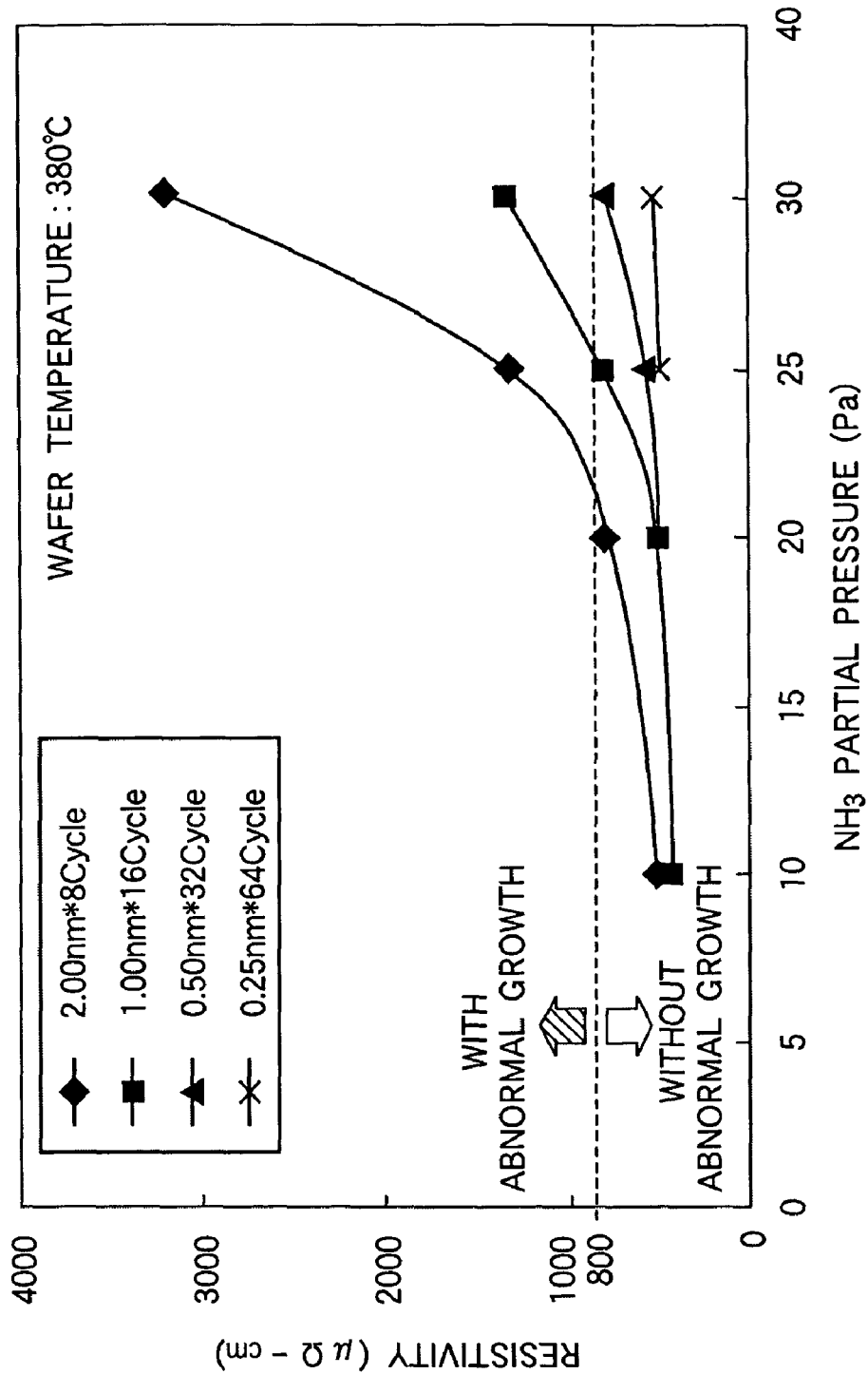
FIG. 3 is a graph showing an effect obtained by a film formation method according to a first embodiment of the present invention.

An experiment was conducted to confirm the matters described above, and the result shown in FIG. 3 was thereby obtained. FIG. 3 shows the relationship between the partial pressure (Pa) of $NH_3$ gas G2 and the resistivity (μΩ-cm) of a formed TiN film, where the intermittent gas supply shown in FIG. 2 was used to perform the film formation while the temperature of a film formation object or wafer W (film formation temperature) was set at 380° C. The total pressure inside the chamber was set at 260 Pa.

As shown in FIG. 3, it is apparent that, along with increase in the film thickness obtained by one cycle, the necessary number of cycles is decreased. For example, where a TiN film is formed to have a final film thickness of 16 nm, and the one-cycle film thickness $T_{hk}$ is set at 2.00 nm, 1.00 nm, 0.50 nm, and 0.25 nm, the necessary number of cycles is 8, 16, 32, and 64, respectively. As the one-cycle film thickness is larger and the number of cycles is smaller, the throughput becomes higher, although abnormal growth and resistivity increase can easily occur.

It has been confirmed from FIG. 3 that, where the partial pressure of $NH_3$ gas G2 is set to be 30 Pa or less, a practical film thickness of 0.50 nm (32 cycles) for the one-cycle film thickness can provide a resistivity of 800 μΩ-cm or less. A resistivity within this range is appropriate for an upper electrode and also prevents abnormal growth. Further, it has been confirmed that, where the partial pressure of $NH_3$ gas G2 is set to be 20 Pa or less, a larger value, such as 1.00 nm (16 cycles) or 2.00 nm (8 cycles), for the one-cycle film thickness can provide a film with a low resistivity and no abnormal growth.

The other conditions are as follows. The partial pressure of $TiCl_4$ gas G1 in the first step is set to be, e.g., 1 to 100 Pa, and preferably to be more than 10 Pa and not more than 100 Pa in consideration of improvement of the step coverage. The partial pressure of $NH_3$ gas G2 in the second step is set to be, e.g., 10 to 1,300 Pa, preferably more than 40 Pa, and more preferably more than 100 Pa. In other words, it is preferable that the pressure of $NH_3$ gas occupies most of the gas pressure. As regards flow rates of supplied gases, $TiCl_4$ gas G1 is set to be, e.g., 5 to 200 mL/min. $NH_3$ gas G2 is set to be, e.g., 5 to 300 mL/min for film formation in the first step, and to be, e.g., 30 to 5,000 mL/min for annealing in the second step. $N_2$ gas G3 for purging is set to be, e.g., 50 to 5,000 mL/min, and preferably 50 to 1,000 mL/min.

In order to form a high quality film while further suppressing abnormal growth, the flow rate of $NH_3$ gas G2 in the first step is preferably set to be 20 mL/min or more. There is no specific upper limit for this flow rate, but a range of 20 to 300 mL/min is practically adopted.

In light of conditions other than the $NH_3$ gas partial pressure and total pressure in the first step, preferable conditions are as follows.

Total pressure: more than 100 Pa, $NH_3$ partial pressure in first step: 30 Pa or less (preferably 20 Pa or less, and more preferably 15 Pa), $TiCl_4$ gas partial pressure: more than 10 Pa and not more than 100 Pa, $NH_3$ gas flow rate in first step: 20 mL/min or more, and One-cycle film thickness: 0.50 nm or less where $NH_3$ partial pressure is 30 Pa or less, and 2.00 nm or less where $NH_3$ partial pressure is 20 Pa or less.

When a TiN film is formed, as shown in FIG. 2, the time period of the first step is set to be, e.g., 2 to 8 seconds, the time period of purging thereafter is set to be, e.g., 0.5 to 20 seconds, the time period of the second step is set to be, e.g., 0.5 to 8 seconds, and the time period of purging thereafter is set to be, e.g., 0.5 to 20 seconds.

When the TiN film formation step is finished, $NH_3$ gas and $TiCl_4$ gas are stopped, and $N_2$ gas is supplied as a purge gas through a purge gas line (not shown) at a flow rate preferably of 0.5 to 10 L/min to purge the interior of the chamber 51. Then, $N_2$ gas and $NH_3$ gas are supplied to perform a nitridation process on the surface of the TiN thin film formed on the wafer W. At this time, $N_2$ gas is supplied from one or both of the first and second $N_2$ gas supply sources 113 and 115. It should be noted that this nitridation process is dispensable.

When a predetermined time has elapsed, $N_2$ gas and $NH_3$ gas are gradually decreased until the gases are completely stopped to finish the process.

As described above, in this first embodiment, film formation is performed by alternate gas flows, i.e., the first step and second step, with purging interposed therebetween, under a film formation temperature of less than 450° C., and preferably less than 400° C., such as 380° C. During this film formation, the partial pressure of a nitrogen-containing reducing gas or NH$_3$ gas G2 is set to be 30 Pa or less, preferably 20 Pa or less, and more preferably less that 15 Pa. Consequently, a TiN film which is formed with sufficient time by a suppressed film formation rate in the first step is efficiently dechlorinated by annealing of the second step to decrease the residual chlorine in the film to a very low level. As a result, even where the film formation is performed at a low temperature, a high quality TiN film can be formed with very little residual chlorine and a low resistivity. Further, since the total pressure is set to be as high as more than 100 Pa, the step coverage is improved.

In other words, a high quality TiN film with a low resistivity and no abnormal growth can be formed with high step coverage, at a low temperature of less than 450° C., and preferably less than 400° C. With this temperature, the film formation can be performed without causing damage to the underlayers even where the underlayers include a high dielectric constant film used as a capacitor material in DRAM memory sections, such as $Ta_2O_5$, $HfO_2$, HfSiO, PZT, BST, $RuO_2$, or $ReO_2$, or a film sensitive to heat, such as NiSi, used as a contact material.

It may be arranged such that the alternate type film formation with an NH$_3$ partial pressure of 30 Pa or less described above is performed at a low temperature of less than 450° C. (a first film formation step) only in the initial stage of the film formation until a TiN thin film reaches a thickness that can cut off the influence onto underlayers. In this case, it may be arranged such that, following the first film formation step, ordinary continuous CVD-TiN film formation (continuous film formation) is sequentially performed at a temperature 450° C. or more, or film formation using the cycle shown in FIG. 2 is performed at an NH$_3$ partial pressure of 30 Pa or more (a second film formation step). With this arrangement, the throughput is improved.

In this case, the TiN film thickness obtained by the second film formation step is preferably set to be larger than the TiN film thickness obtained by the first film formation step. However, the TiN film thickness obtained by the first film formation step may be set to be larger. The TiN film thickness obtained by the first film formation step is set to be, e.g., 5 to 50 nm, while the TiN film thickness obtained by the second film formation step is set to be, e.g., 5 to 95 nm.

Next, an explanation will be given of a second embodiment.

As could be understood from FIG. 3 described above, where the film thickness obtained by one cycle is decreased while the number of cycles is increased, the throughput becomes lower, but a high quality TiN film can be formed even if the partial pressure of NH$_3$ gas G2 exceeds 30 Pa. Accordingly, in this embodiment, process conditions are selected in consideration of the interaction thereof with the NH$_3$ gas partial pressure and the film quality.

As described above, the film quality of a formed film can be judged on the basis of the resistivity. It is known that, if the resistivity is 800 μΩ-cm or less, the film quality is high with very little abnormal growth. Accordingly, the NH$_3$ gas partial pressure and one-cycle film thickness are determined so that the resistivity is 800 μΩ-cm or less.

Figure 4:
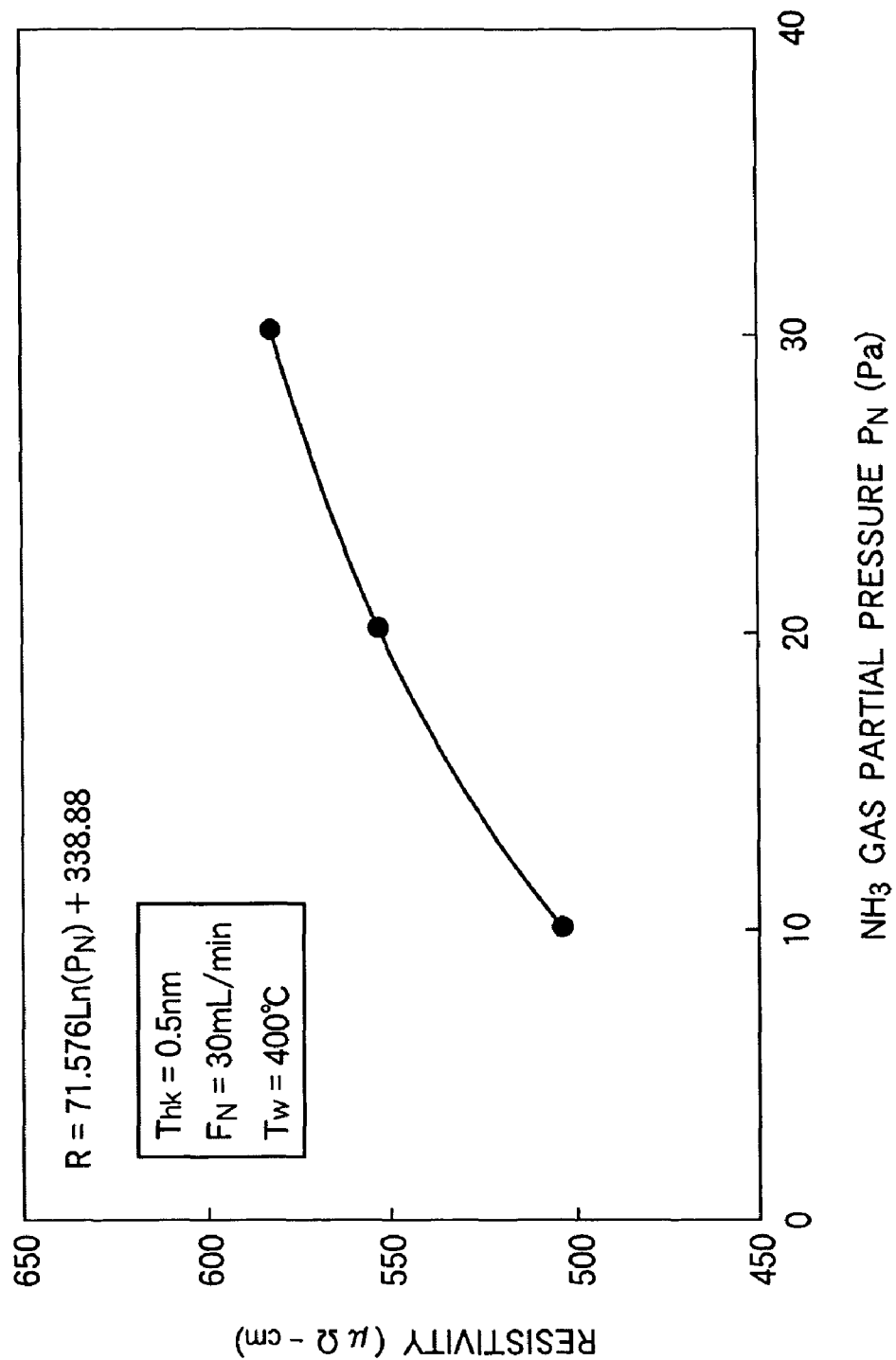
FIG. 4 is a view showing the relationship between the $NH_3$ gas partial pressure used in the first step and the resistivity of a formed TiN film.

FIG. 4 is a graph showing the relationship between the NH$_3$ gas partial pressure P$_N$ and the TiN film resistivity. In this case, the one-cycle film thickness T$_{hk}$ is set at 0.5 nm, the NH$_3$ gas flow rate F$_N$ is set at 30 mL/min, and the wafer temperature T$_W$ is set at 400° C. As shown in FIG. 4, along with an increase in the NH$_3$ gas partial pressure P$_N$, the resistivity increases to draw a curve. This curve is calculated or expressed by the following formula (1) where R denotes the TiN film resistivity.

$$R=71.576Ln(P_N)+338.88 \quad (1)$$

Figure 5:
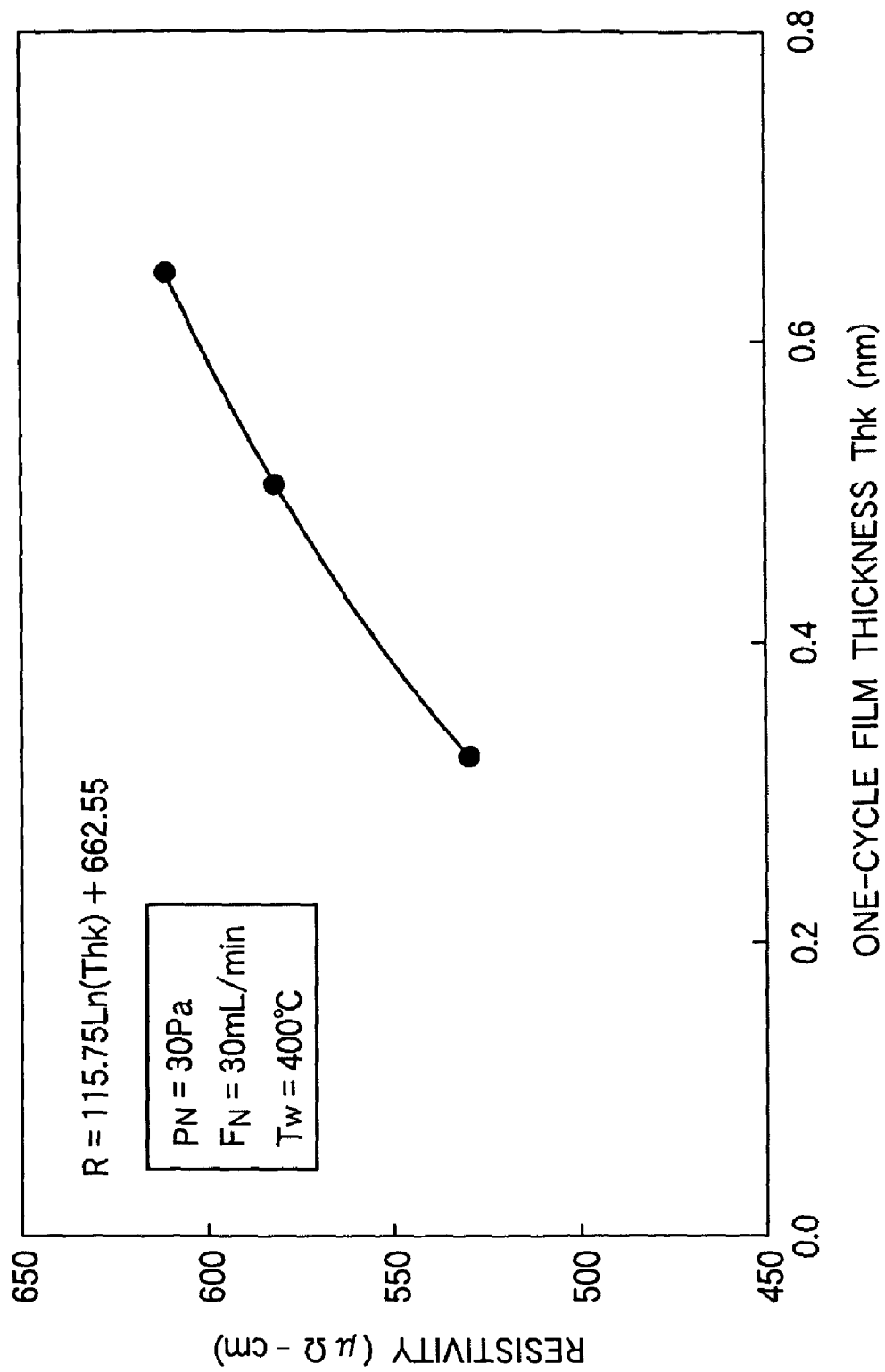
FIG. 5 is a view showing the relationship between the thickness of a TiN film formed by one cycle and the resistivity of a formed TiN film.

FIG. 5 is a graph showing the relationship between the one-cycle film thickness T$_{hk}$ and the TiN film resistivity. In this case, the NH$_3$ gas partial pressure P$_N$ is set at 30 Pa, the NH$_3$ gas flow rate F$_N$ is set at 30 mL/min, and the wafer temperature T$_W$ is set at 400° C. As shown in FIG. 5, along with an increase in the one-cycle film thickness T$_{hk}$, the resistivity increases to draw a curve. This curve is calculated or expressed by the following formula (2) where R denotes the TiN film resistivity.

$$R=115.75Ln(T_{hk})+662.55 \quad (2)$$

From the relationships shown in FIGS. 4 and 5, the following formula (3) can be obtained, which expresses the influence of the NH$_3$ gas partial pressure P$_N$ and the one-cycle film thickness T$_{hk}$ on the TiN film resistivity R.

$$R=115.75\times Ln(T_{hk})+71.576\times Ln(P_N)+418.8 \quad (3)$$

Accordingly, the NH$_3$ gas partial pressure P$_N$ and one-cycle film thickness T$_{hk}$ are determined so that the TiN film resistivity R expressed by the formula (3) does not more than 800 μΩ-cm. With this arrangement, a high quality film with very little abnormal growth can be obtained. Further, also in this embodiment, the total pressure inside the chamber 51 is set to be higher than 100 Pa during the film formation to improve the step coverage, as in the first embodiment. The NH$_3$ gas partial pressure P$_N$ can be adjusted by the flow rate of N$_2$ gas supplied as a dilution gas.

Figure 6:
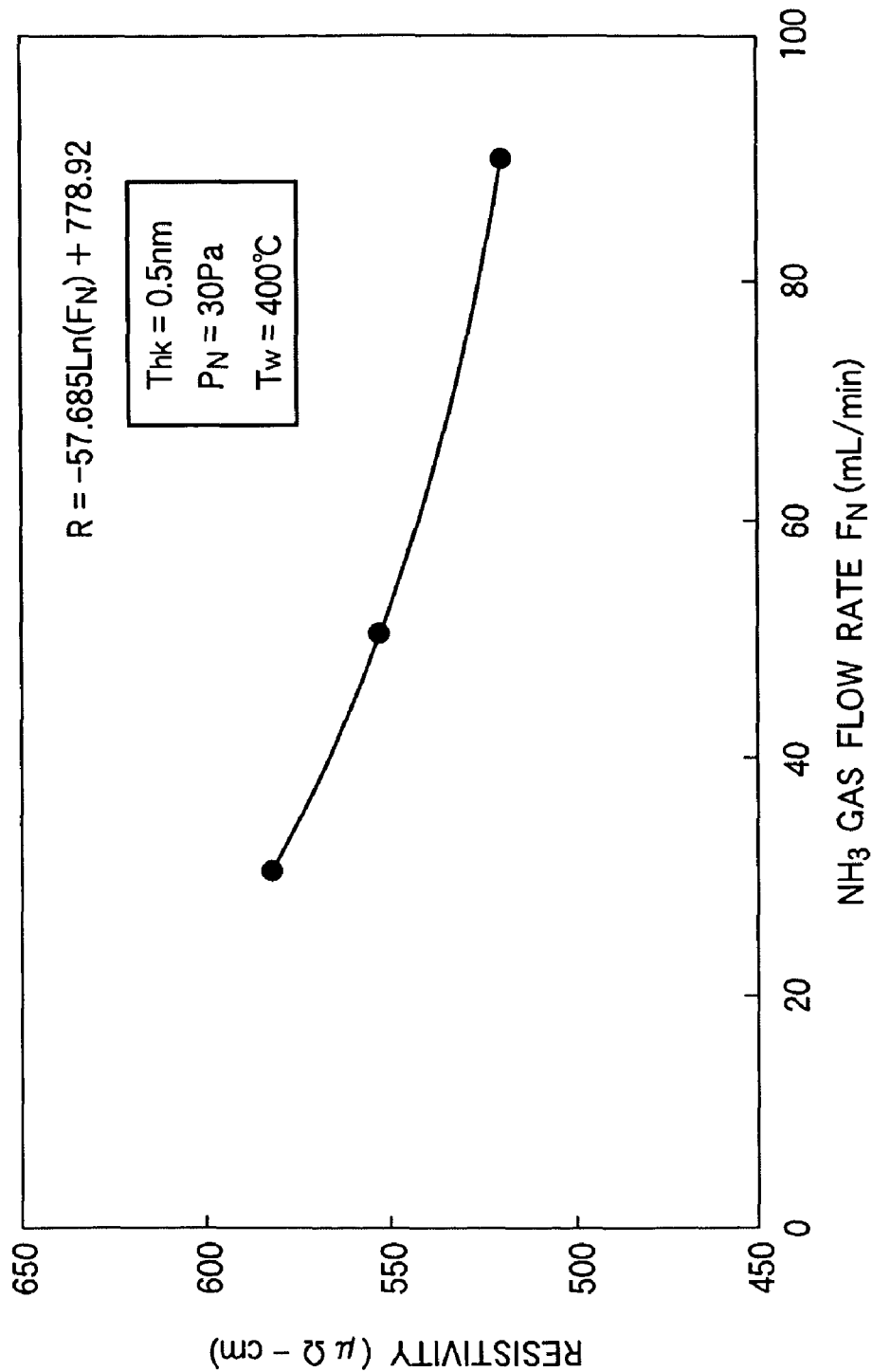
FIG. 6 is a view showing the relationship between the $NH_3$ gas flow rate used in the first step and the resistivity of a formed TiN film.

Incidentally, the TiN film resistivity also correlates with the NH$_3$ gas flow rate F$_N$, and FIG. 6 shows the relationship therebetween. In this case, the NH$_3$ gas partial pressure P$_N$ is set at 30 Pa, the one-cycle film thickness T$_{hk}$ is set at 0.5 nm, and the wafer temperature T$_W$ is set at 400° C. As shown in FIG. 6, along with an increase in the NH$_3$ gas flow rate F$_N$, the resistivity decreases to draw a curve. This curve is calculated or expressed by the following formula (4) where R denotes the TiN film resistivity.

$$R=-57.685Ln(F_N)+778.92 \quad (4)$$

From the relationship shown in FIG. 6 in addition to the relationships shown in FIGS. 4 and 5, the following formula (5) can be obtained, which expresses the TiN film resistivity in consideration of the NH$_3$ gas flow rate F$_N$ in addition to the NH$_3$ gas partial pressure P$_N$ and one-cycle film thickness T$_{hk}$.

$$R=115.75\times Ln(T_{hk})+71.576\times Ln(P_N)-57.685\times Ln(F_N)+614 \quad (5)$$

Accordingly, the NH$_3$ gas flow rate F$_N$ can be considered in addition to the NH$_3$ gas partial pressure P$_N$ and one-cycle film thickness T$_{hk}$. In this case, the NH$_3$ gas partial pressure P$_N$, one-cycle film thickness T$_{hk}$, and NH$_3$ gas flow rate F$_N$ are determined so that the TiN film resistivity R expressed by the formula (5) does not more than 800 μΩ-cm.

Figure 7:
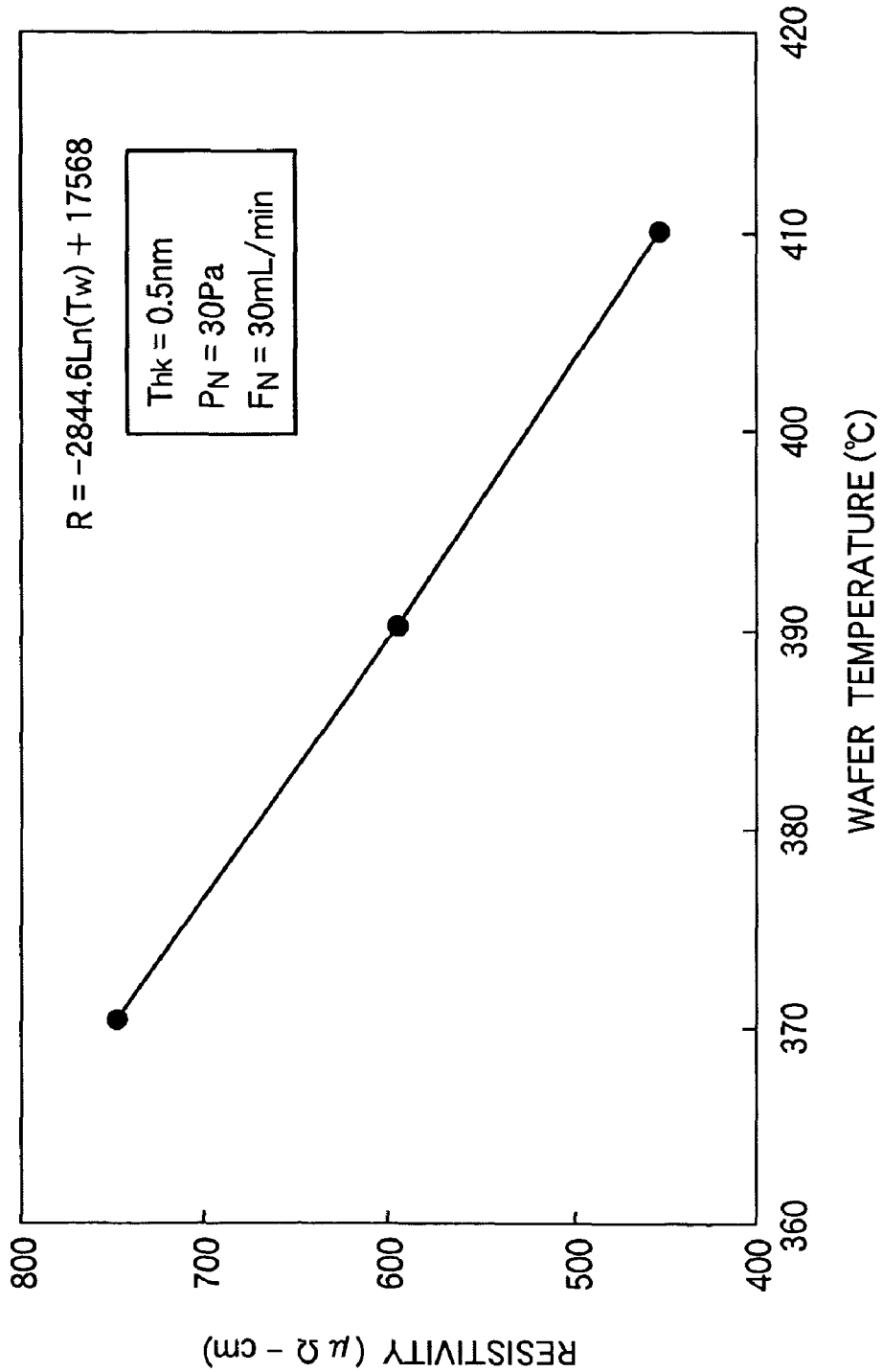
FIG. 7 is a view showing the relationship between the temperature of a semiconductor wafer during film formation and the resistivity of a formed TiN film.

This embodiment is set on the condition that the film formation is performed at a low temperature of less than 450° C., and is arranged to form a high quality TiN film with a low resistivity even by such low temperature film formation. The TiN film resistivity also correlates with the wafer temperature T$_W$, and FIG. 7 shows the relationship therebetween. In this case, the NH$_3$ gas partial pressure P$_N$ is set at 30 Pa, the one-cycle film thickness T$_{hk}$ is set at 0.5 nm, and the NH$_3$ gas flow rate $F_N$ is set at 30 mL/min. As shown in FIG. 7, along with an increase in the wafer temperature, the resistivity decreases to draw a curve. This curve is calculated or expressed by the following formula (6) where R denotes the TiN film resistivity.

$$R=-2844.6Ln(T_W)+17568 \quad (6)$$

From the relationship shown in FIG. 7 in addition to the relationships shown in FIGS. 4, 5, and 6, the following formula (7) can be obtained, which expresses the TiN film resistivity in consideration of the wafer temperature $T_W$ in addition to the $NH_3$ gas partial pressure $P_N$, one-cycle film thickness $T_{hk}$, and $NH_3$ gas flow rate $F_N$.

$$R=115.75 \times Ln(T_{hk})+71.576 \times Ln(P_N)-57.685 \times Ln(F_N)-2844.6Ln(T_W)+17658.3 \quad (7)$$

Accordingly, the wafer temperature $T_W$ can be considered in addition to the $NH_3$ gas partial pressure $P_N$, one-cycle film thickness $T_{hk}$, and $NH_3$ gas flow rate $F_N$. In this case, the $NH_3$ gas partial pressure $P_N$, one-cycle film thickness $T_{hk}$, $NH_3$ gas flow rate $F_N$, and wafer temperature $T_W$ are determined so that the TiN film resistivity R expressed by the formula (7) does not more than 800 μΩ-cm.

Figure 8:
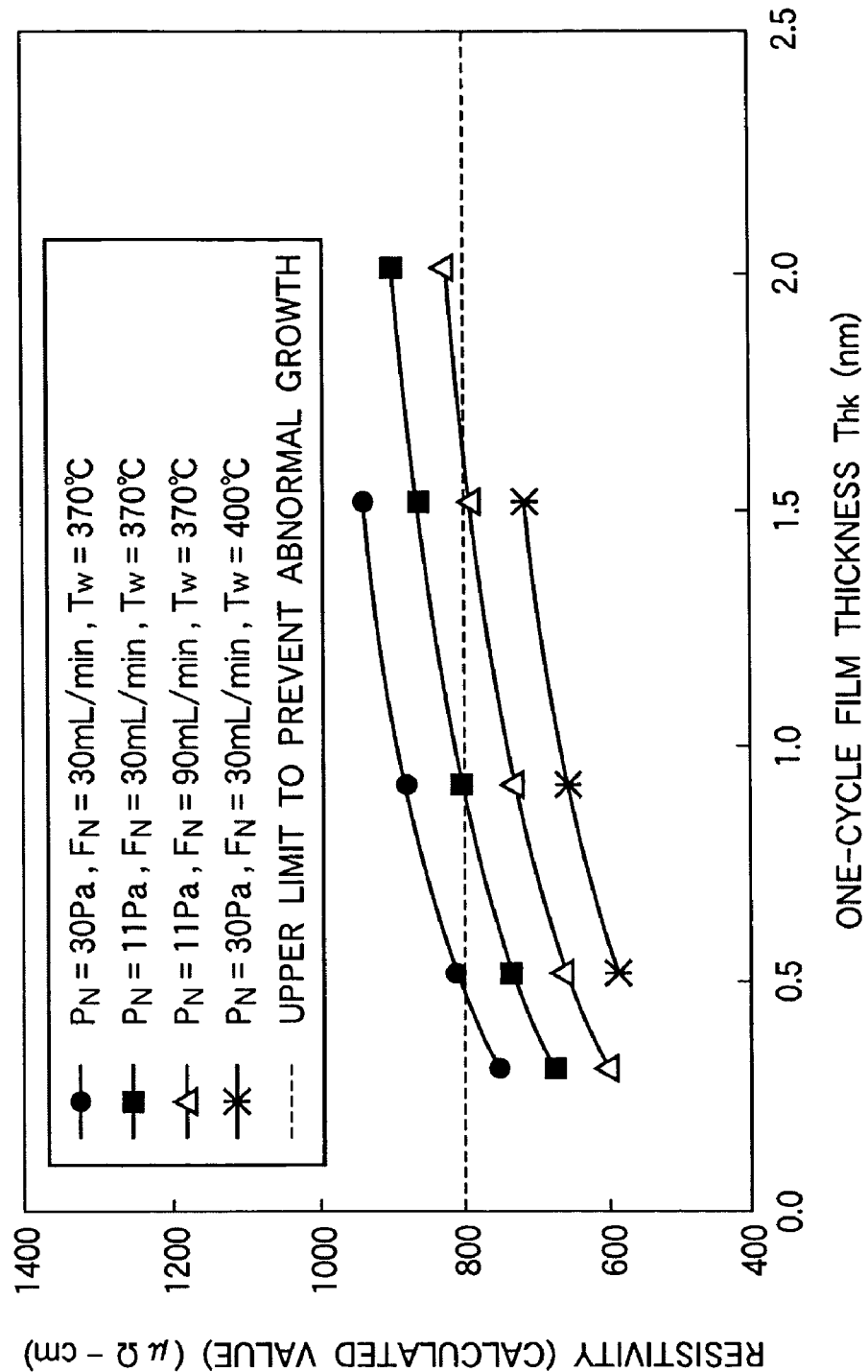
FIG. 8 is a graph showing the relationship between the one-cycle film thickness $T_{hk}$, which is denoted on the horizontal axis, and the TiN film resistivity R calculated by a formula (7), which is denoted on the vertical axis.
Figure 9:
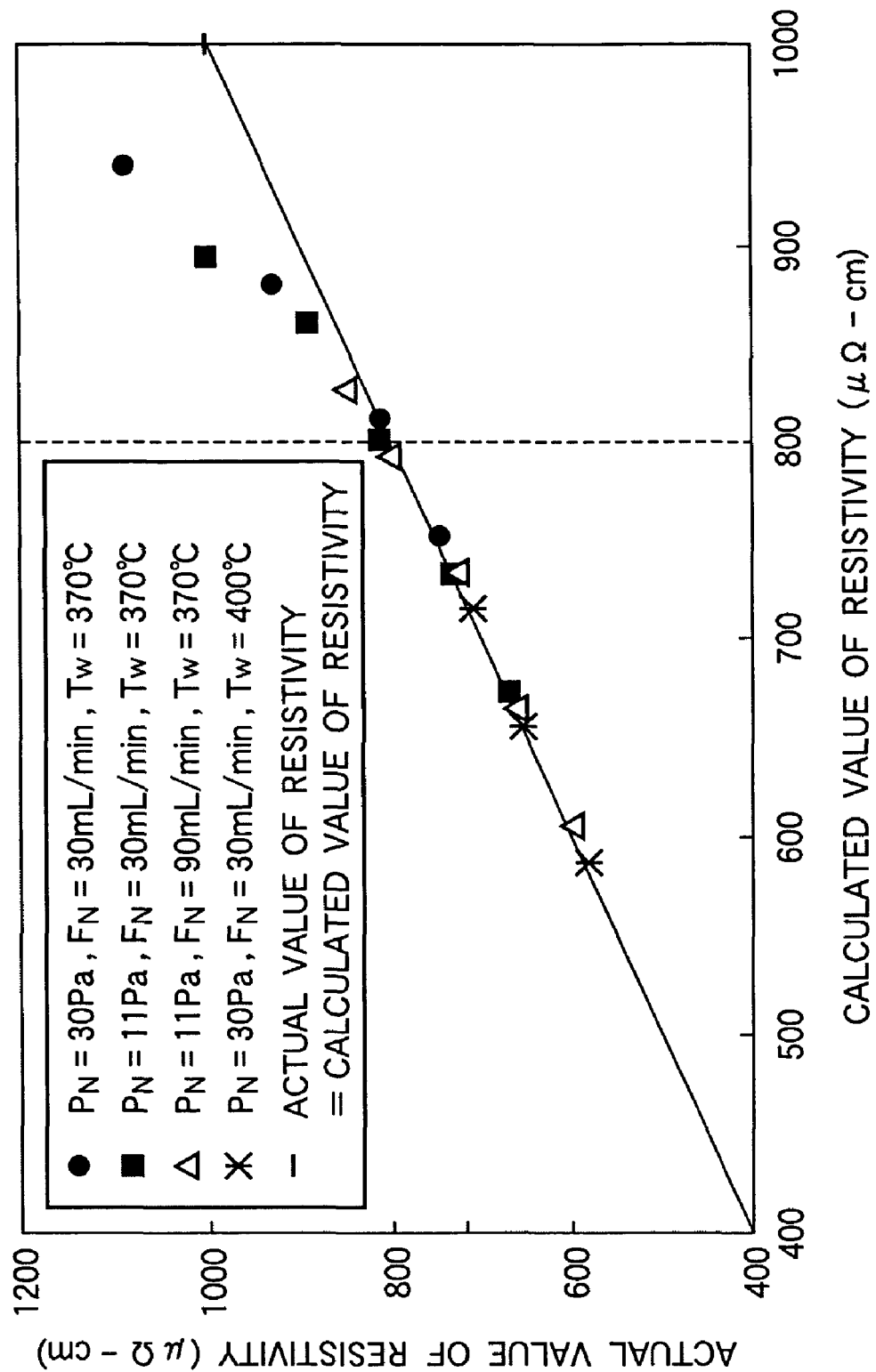
FIG. 9 is a graph showing the relationship between the TiN film resistivity R calculated by the formula (7) and the actual resistivity thereof.

FIG. 8 is a graph showing the relationship between the one-cycle film thickness $T_{hk}$, which is denoted on the horizontal axis, and the TiN film resistivity R calculated by a formula (7), which is denoted on the vertical axis, where the parameters described above are changed. FIG. 9 is a graph showing the relationship between the calculated value and actual value of the resistivity. As shown in FIG. 9, until the TiN film resistivity reaches 800 μΩ-cm, the actual value almost agrees with the calculate value. Where the resistivity exceeds 800 μΩ-cm, the actual value tends to be higher than the calculate value. This is so, because the resistivity is increased virtually by an increase in Cl concentration in the film until 800 μΩ-cm, but then the resistivity is increased not only by the Cl concentration increase but also by film roughness, which rapidly appears due to abnormal growth, from 800 μΩ-cm. In other words, the difference between the calculated resistivity and actual resistivity can prove the presence of abnormal growth above 800 μΩ-cm. In any case, the calculation formula described above provides resistivity values almost identical to actual values until 800 μΩ-cm. Accordingly, as long as the TiN film resistivity R calculated by the calculate formula is 800 μΩ-cm or less, it can be said that hardly any abnormal growth is present.

According to this embodiment, it suffices if any one of the formulas (3), (5), and (7) is held, and the total pressure inside the chamber 51 is set to be more than 100 Pa. However, in the first step, the $NH_3$ gas partial pressure, $NH_3$ gas flow rate, one-cycle film thickness, and wafer temperature are preferably set as follows.

$NH_3$ partial pressure in first step: 70 Pa or less,
$NH_3$ gas flow rate in first step: 10 mL/min or more,
One-cycle film thickness: 2.5 nm or less, and
Wafer temperature: 300 to 450° C.

In addition, as in the first embodiment, the $TiCl_4$ gas partial pressure is preferably set to be more than 10 Pa and not more than 100 Pa. The other conditions may be the same as those described in the first embodiment.

As described above, this embodiment is arranged such that any one of the formulas (3), (5), and (7) is held, and the total pressure is set to be more than 100 Pa, so that a high quality TiN film with a low resistivity and no abnormal growth can be formed with high step coverage, at a low temperature of less than 450° C., and preferably less than 400° C. With this temperature, the film formation can be performed without causing damage to the underlayers even where the underlayers include a high dielectric constant film used as a capacitor material in DRAM memory sections, such as $Ta_2O_5$, $HfO_2$, HfSiO, PZT, BST, $RuO_2$, or $ReO_2$, or a film sensitive to heat, such as NiSi, used as a contact material.

Also in this embodiment, it may be arranged such that the alternate type film formation using the film formation gas and reducing gas with the conditions described above is performed at a low temperature of less than 450° C. (a first film formation step) only in the initial stage of the film formation until a TiN thin film reaches a thickness that dose not have the effect on an underlayer, then ordinary continuous CVD-TiN film formation (continuous film formation) is sequentially performed at a temperature 450° C. or more (a second film formation step). With this arrangement, the throughput is improved. In this case, as in the first embodiment, the TiN film thickness obtained by the second film formation step is preferably set to be larger than the TiN film thickness obtained by the first film formation step. However, the TiN film thickness obtained by the first film formation step may be set to be larger. Further, as in the first embodiment, the film thickness obtained by the first film formation step is set to be, e.g., 5 to 50 nm, while the film thickness obtained by the second film formation step is set to be, e.g., 5 to 95 nm.

Figure 10:
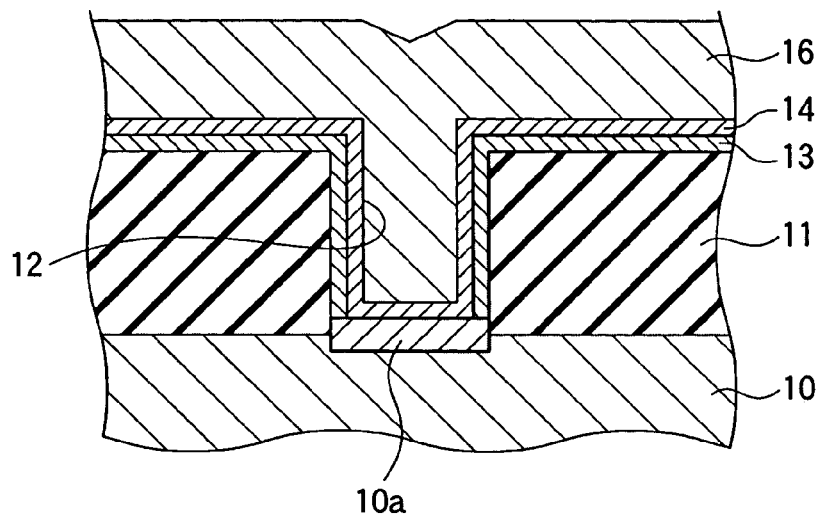
FIG. 10 is a sectional view showing an example where a TiN thin film formed by a film formation method according to the present invention is used at a contact portion of a metal interconnection layer.

Next, an explanation will be given, with reference to FIG. 10, of a case where a TiN thin film formed by a film formation method according to the present invention is applied to formation of a contact portion of a metal interconnection layer. In the example shown in FIG. 10, an Si substrate is provided with an NiSi film 10 used as, e.g., an interconnection layer, on which an interlevel insulating film 11 is disposed. The interlevel insulating film 11 has a contact hole 12 that reaches the NiSi film 10. A Ti thin film 13 is disposed on the interlevel insulating film 11 and in the contact hole 12. At the connecting portion between the Ti thin film 13 and NiSi film 10, a TiSi portion 10a is formed by diffusion of Ti and Si from the Ti thin film 13 and NiSi film 10, respectively. A TiN thin film 14 is formed on the Ti thin film 13 at a low temperature by a method according to the present invention.

The NiSi film 10 present as an underlayer below the TiN thin film 14 is low in heat resistance and thus is sensitive to heat. However, according to the present invention, since the TiN thin film 14 is formed at a low temperature of less than 450° C., the NiSi film 10 does not receive thermal damage, thereby providing a good contact.

On this TiN thin film 14, a metal interconnection layer 16 formed of, e.g., Cu or W is further stacked. The metal interconnection layer 16 fills the contact hole 12 so that it is electrically connected to the NiSi film 10 through the TiSi portion 10a. As described above, the TiN thin film 14 can be formed while the low resistivity of the TiSi portion 10a is maintained, so the metal interconnection layer 16 is connected to the NiSi film 10 through the TiSi portion 10a with a good electrical connection. This structure can be applied to a case where the underlayer is a CoSi film.

Figure 11:
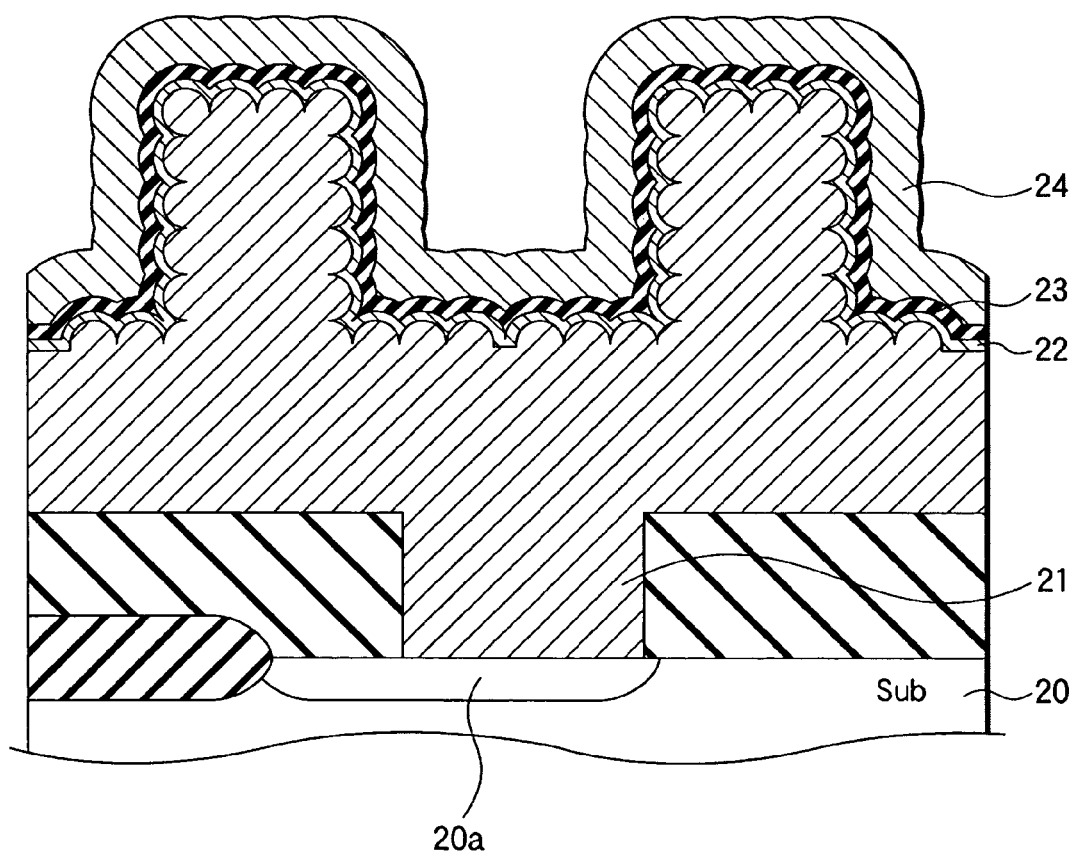
FIG. 11 is a sectional view showing an example where a TiN thin film formed by a film formation method according to the present invention is used in a capacitor structure, such as a DRAM.

Next, an explanation will be given, with reference to FIG. 11, of a case where a TiN thin film according to the present invention is applied to a capacitor structure, such as a DRAM. In the example shown in FIG. 11, an Si substrate 20 has an impurity diffusion region 20a connected to a lower electrode layer 21 made of HSG (hemispherical grained) poly-crystalline silicon. The lower electrode layer 21 has concave and convex surface portions to increase the surface area (i.e., to increase the charge storage capacity of the capacitor). A very thin SiN barrier layer 22 is formed on the lower electrode layer 21 by an RTN (Rapid Thermal Nitridation) process. A $Ta_2O_5$ dielectric layer 23 is disposed on the barrier layer 22.

Further, an upper electrode layer 24 is disposed on the dielectric layer 23 including the concave surface portions. The upper electrode layer 24 is a TiN thin film formed with high coverage by a film formation method according to the present invention. A metal interconnection layer (not shown) is disposed on the upper electrode layer 24.

When the TiN thin film used as the upper electrode layer 24 is formed, the $Ta_2O_5$ dielectric layer 23 is present as an underlayer, which is thermally unstable and apt to receive damage. However, according to the present invention, since the TiN film used as the upper electrode layer 24 is formed at a low temperature of less than 450° C., the $Ta_2O_5$ insulating layer 23 sensitive to heat does not receive damage. Consequently, it is possible to maintain good capacitance, thereby improving the yield of capacitor portions and further the yield of memory devices as a whole.

Figure 12:
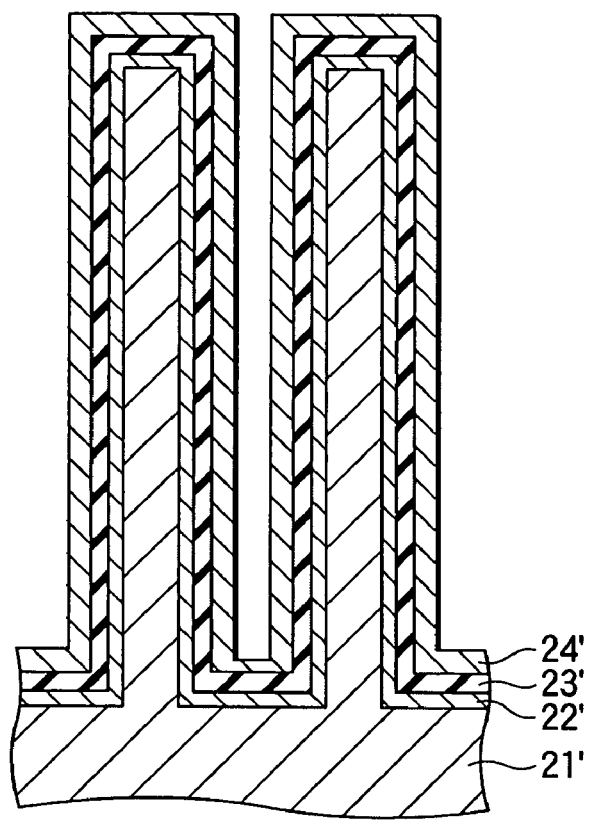
FIG. 12 is a sectional view showing another example where a TiN thin film formed by a film formation method according to the present invention is used in a capacitor structure, such as a DRAM.

Next, an explanation will be given, with reference to FIG. 12, of a case where a TiN thin film according to the present invention is applied to a capacitor structure, such as a DRAM. In the example shown in FIG. 12, an Si substrate has an impurity diffusion region (not shown) connected to a lower electrode layer 21' made of poly-crystalline silicon. The lower electrode layer 21' has fine shapes with a high aspect ratio to increase the surface area (i.e., to increase the charge storage capacity of the capacitor). Each of the fine shapes of the lower electrode layer 21' is set to have an aspect ratio of 12 or more, and preferably 15 to 100. A very thin SiN barrier layer 22' is formed on the lower electrode layer 21' by an RTN (Rapid Thermal Nitridation) process. A $Ta_2O_5$ dielectric layer 23' is disposed on the barrier layer 22'. Further, an upper electrode layer 24' is disposed on the dielectric layer 23' including recess portions. The upper electrode layer 24' is a TiN thin film formed with high coverage by a film formation method according to the present invention. A metal interconnection layer (not shown) is disposed on the upper electrode layer 24'.

Also in this case, since the TiN film used as the upper electrode layer 24' is formed at a low temperature of less than 450° C., the $Ta_2O_5$ dielectric layer 23' sensitive to heat does not receive damage. Consequently, it is possible to maintain good capacitance, thereby improving the yield of capacitor portions and further the yield of memory devices as a whole.

Figure 13:
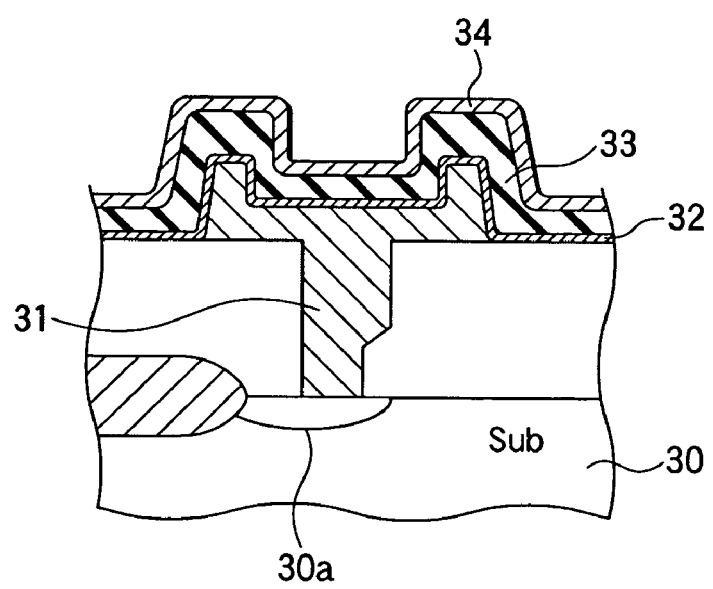
FIG. 13 is a sectional view showing an alternative example where a TiN thin film formed by a film formation method according to the present invention is used in a capacitor structure, such as a DRAM.

Next, an explanation will be given, with reference to FIG. 13, of a case where a TiN thin film according to the present invention is applied to a capacitor structure, such as a DRAM. In the example shown in FIG. 13, an Si substrate 30 has an impurity diffusion region 30a connected to a lower electrode layer 31 made of amorphous Si. A $Ta_2O_5$ dielectric layer 33 is disposed on the lower electrode layer 31 through an SiN barrier layer 32 formed by subjecting silicon to an RTN (Rapid Thermal Nitridation) process. Further, an upper electrode layer 34, which is a TiN based thin film according to the present invention, is disposed on the dielectric layer 33. A metal interconnection layer (not shown) is disposed on the upper electrode layer 34.

Also in this case, since the TiN film used as the upper electrode layer 34 is formed at a low temperature of less than 450° C., the $Ta_2O_5$ dielectric layer 33 sensitive to heat does not receive damage. Consequently, it is possible to maintain good capacitance, thereby improving the yield of capacitor portions and further the yield of memory devices as a whole.

The present invention is not limited to the embodiments described above, and it may be modified in various manners. For example, in the embodiments described above, $TiCl_4$ is used as a Ti-containing compound gas, but another gas, such as an organic Ti compound, may be used. Further, $NH_3$ is used as a nitrogen-containing reducing gas, but another gas, such as MMH, may be used. In the embodiments described above, the present invention is applied to TiN film formation, but it may be applied to another film formation of an ordinary metal nitride film, such as TaN or WN. Further, the target substrate is exemplified by a semiconductor wafer, but it may be another substrate, such as a substrate for liquid crystal display devices.

The invention claimed is:

1. A film formation method for forming a metal nitride film having a predetermined thickness on a target substrate within a process container configured to be selectively supplied with a metal compound gas and a nitrogen-containing reducing gas, the film formation method being preset to repeat a cycle a plurality of times while heating the target substrate at a film formation temperature, the cycle comprising:
    a first step of supplying the metal compound gas and the nitrogen-containing reducing gas into the process container, thereby forming a film of a metal nitride by CVD, while carrying the metal compound gas via nitrogen gas supplied through a first flow-rate controller and carrying the nitrogen-containing reducing gas via nitrogen gas supplied through a second flow-rate controller;
    then, a first purge step of supplying a purge gas into the process container without supplying the metal compound gas and the nitrogen-containing reducing gas into the process container, thereby purging the process container;
    then, a second step of supplying the nitrogen-containing reducing gas into the process container without supplying the metal compound gas into the process container, while carrying the nitrogen-containing reducing gas via nitrogen gas supplied through the second flow-rate controller; and
    then, a second purge step of supplying a purge gas into the process container without supplying the metal compound gas and the nitrogen-containing reducing gas into the process container, thereby purging the process container,
    wherein the film formation temperature is set to be less than 450° C., the process container is set to have therein a total pressure of 100 to 667 Pa in the first and second steps, the nitrogen-containing reducing gas is set to have a partial pressure of 30 Pa or less within the process container in the first step, and the nitrogen-containing reducing gas is set to have a partial pressure of more than 100 Pa within the process container in the second step.

2. The film formation method according to claim 1, wherein a film thickness obtained by the cycle performed once is set to be 0.50 nm or less.

3. The film formation method according to claim 1, wherein, in the first step, the nitrogen-containing reducing gas is set to have a partial pressure of 20 Pa or less within the process container.

4. The film formation method according to claim 3, wherein a film thickness obtained by the cycle performed once is set to be 2.0 nm or less.

5. The film formation method according to claim 1, wherein, in the first step, the nitrogen-containing reducing gas is set to have a partial pressure of 15 Pa or less within the process container.

6. The film formation method according to claim 1, wherein the film formation temperature is set to be 400° C. or less.

7. The film formation method according to claim 1, wherein the metal compound gas is $TiCl_4$ and the nitrogen-containing reducing gas is $NH_3$.

8. A film formation method for forming a TiN film having a predetermined thickness on a target substrate within a process container configured to be selectively supplied with a Ti compound gas and a nitrogen-containing reducing gas, the film formation method being preset to repeat a cycle a plurality of times while heating the target substrate at a film formation temperature, the cycle comprising:
- a first step of supplying the Ti compound gas and the nitrogen-containing reducing gas into the process container, thereby forming a film of TiN by CVD, while carrying the Ti compound gas via nitrogen gas supplied through a first flow-rate controller and carrying the nitrogen-containing reducing gas via nitrogen gas supplied through a second flow-rate controller;
- then, a first purge step of supplying a purge gas into the process container without supplying the Ti compound gas and the nitrogen-containing reducing gas into the process container, thereby purging the process container;
- then, a second step of supplying the nitrogen-containing reducing gas into the process container without supplying the Ti compound gas into the process container, while carrying the nitrogen-containing reducing gas via nitrogen gas supplied through the second flow-rate controller; and
- then, a second purge step of supplying a purge gas into the process container without supplying the Ti compound gas and the nitrogen-containing reducing gas into the process container, thereby purging the process container,
- wherein the film formation temperature is set to be less than 450° C., the process container is set to have therein a total pressure of 100 to 667 Pa in the first and second steps, the nitrogen-containing reducing gas is set to have a partial pressure of 30 Pa or less within the process container in the first step, and the nitrogen-containing reducing gas is set to have a partial pressure of more than 100 Pa within the process container in the second step.

9. The film formation method according to claim 8, wherein the Ti compound gas is $TiCl_4$ and the nitrogen-containing reducing gas is $NH_3$.

10. The film formation method according to claim 8, wherein a film thickness obtained by the cycle performed once is set to be 0.50 nm or less.

11. The film formation method according to claim 8, wherein, in the first step, the nitrogen-containing reducing gas is set to have a partial pressure of 20 Pa or less within the process container.

12. The film formation method according to claim 11, wherein a film thickness obtained by the cycle performed once is set to be 2.0 nm or less.

13. The film formation method according to claim 8, wherein, in the first step, the nitrogen-containing reducing gas is set to have a partial pressure of 15 Pa or less within the process container.

14. The film formation method according to claim 8, wherein the film formation temperature is set to be 400° C. or less.

15. The film formation method according to claim 8, wherein, in the first step, the nitrogen-containing reducing gas is set at a flow rate of 20 mL/min or more.

16. The film formation method according to claim 8, wherein, in the first step, the Ti compound gas is set to have a partial pressure of more than 10 Pa and not more than 50 Pa.

17. The film formation method according to claim 8, wherein the TiN film is set to have a resistivity of 800 µΩ-cm or less.

* * * * *